United States Patent [19]
Walsh, Jr.

[11] Patent Number: 5,437,758
[45] Date of Patent: Aug. 1, 1995

[54] GREEN SHEET MANUFACTURING METHODS AND APPARATUSES

[75] Inventor: Thomas J. Walsh, Jr., Poughkeepsie, N.Y.

[73] Assignee: Joseph B. Taphorn, Poughkeepsie, N.Y.; a part interest

[21] Appl. No.: 521,020

[22] Filed: May 9, 1990

[51] Int. Cl.6 .............................................. B32B 31/18
[52] U.S. Cl. .................................... 156/513; 156/252; 156/253; 83/30; 83/684; 83/685; 83/691
[58] Field of Search ................. 156/252, 253, 89, 513, 156/514; 264/152, 153, 154; 83/30, 683, 684, 685, 686, 691, 687, 660, 663, 669, 635, 308; 29/837, 845, 852

[56] References Cited

U.S. PATENT DOCUMENTS

| | | | |
|---|---|---|---|
| 3,518,756 | 7/1970 | Bennett et al. | 156/89 |
| 3,547,724 | 12/1970 | Zagusta | 156/253 |
| 3,583,266 | 6/1971 | Kondo | 83/685 |
| 3,770,529 | 11/1973 | Anderson | 156/89 |
| 4,020,725 | 5/1977 | Climo | 83/691 |
| 4,039,338 | 8/1977 | Swiss et al. | 156/89 |

FOREIGN PATENT DOCUMENTS 897338 1/1982 U.S.S.R. ........................... 83/30

Primary Examiner—Caleb Weston
Attorney, Agent, or Firm—Joseph B. Taphorn

[57] ABSTRACT

A "green" sheet manufacturing method and apparatus contemplates perforating the "green" sheet with through-holes as it is calendared, rolled or extruded by rollers. To this end, the rollers are each machined with punches of a length one-half the thickness of the "green" sheet and that mate with punches on the other. Any flash or diaphragm obtaining in the through-holes are removed by subsequently exposing the "green" sheet to new mechanisms providing fluid pressure or vibration, or spiking. The bosses or punches may be supplemented with enlargements and other bosses providing for pads and counterholes and grooves in the "green" sheet. The through-holes may be shaped to have a smaller diameter interiorly than at the outer edges to lock in place solder or other conductive media squeegeed into them. The locking action may be enhanced by slightly off-setting bosses or mating punches to produce through-holes whose top and bottom halves are slightly off-set.

9 Claims, 3 Drawing Sheets

GREEN SHEET MANUFACTURING METHODS AND APPARATUSES

BACKGROUND OF THE INVENTION

1. Field of the Invention

This invention relates to methods and apparatuses for manufacturing perforated "green" sheets for use as layered electronic substrates, and more particularly, to methods and apparatuses for introducing through-holes and other pertinent geometries into the "green" sheets during the manufacturing operation.

2. Prior Information

Currently, the substrate "green" sheets for multi-layered ceramic electronic components are manufactured by calendaring, rolling or extruding thin "green" sheets of ceramic slurry or paste between rollers, to the required thickness. They are then sized or slit to width, and then die-punched for the through-holes used for effecting electrical connections from one side to the other of each sheet as a layered substrate. The through-holes are very small in diameter; being in the order of 0.005 inches.

SUMMARY OF THE INVENTION

Because of the small size, close spacing and large number of holes being punched in the "green" sheets, the dies are quite expensive to build and maintain. Furthermore, the punching operation introduces large amounts of stress in the perforated sheet, resulting in frequent subsequent failures of the layered substrate. In addition, desirable geometries such as pads (electrical connection sites for the layered substrate), counterholes (targets used for registering or aligning purposes at layering), and surface circuit grooves cannot be readily created using dies.

Accordingly it is an object of this invention to provide an inexpensive way to create perforated "green" sheets and ones having holes that are small in size, closely spaced, and large in number.

Another object of the invention is to provide perforated "green" sheets that have lower internal stresses.

Another object of the invention is to provide an inexpensive way to put in additional geometries such as pads, counterholes and surface grooves.

A further object of the invention is to provide apparatuses and methods for carrying out the invention that are easy and reliable in operation.

The objects of the invention are achieved by forming bosses or punches on at least one of the set of calendaring, rolling, or extruding rollers. The punches are of a length to reach and make line contact with a cooperating surface, such cooperating surface being either the surface of the other roller or those of registered mating punches mounted thereon. Preferably, each of the punches extends one-half the depth of the "green" sheet, this enabling the thinnest punches in the largest number for a given space.

It may result that not all holes are cleanly "punched" through in the "green" sheet, a flash or diaphragm being left at the area of furthest penetration of a punch. To open the hole by eliminating the flash or diaphragm, the partially perforated "green" sheet is embraced by a pneumatic, hydraulic or the like manifold in which fluid under pressure blasts or shakes the flash or diaphragm out. An alternative mechanism involving a synchronized roller or plate with spikes slightly longer than the roller punches, moves to cause the spikes to pop out any flash or diaphragm.

A feature of the invention is that ends of the roller punches can be so designed that any flash or diaphragm obtaining has a slightly thicker center to facilitate popping out the flash or diaphragm about its perimeter.

Another feature of the invention is that desirable geometries such as pads, counterholes and surface circuit grooves may be added to the "green" sheets as part of the roller "punching" operation. Pads may be readily created by enlarging the inner base portion of the corresponding punches. Counterholes may be formed by additional sets of suitably located punches. Surface circuit grooves running in any direction may be created by interconnecting the corresponding punches with slight ridges on the surfaces of the calendaring, rolling or extruding rollers.

Still another feature of the invention is that holes created by the roller punches will tend to flare outwards at their ends, thus locking-in against displacement any filler such as solder or other conductive media for making through-hole electrical connections. Enhanced locking action can also be achieved by a slight mis-alignment of mating punches, thereby creating through-holes with slightly offsetting top and bottom portions.

An advantage of the invention is that perforated through-hole "green" sheets can be formed in one continuous high speed operation, and with potential peripheral cutting.

A further advantage of the invention is that a denser pattern of through-holes can be laid down because of the denser packing of the punches and the lower stresses engendered in the "green" sheet.

BRIEF DESCRIPTION OF DRAWINGS

These and other objects, features, and advantages of my invention will become apparent from a reading of the following description of preferred embodiments when considered with the accompanying drawing wherein.

DETAILED DESCRIPTION OF PREFERRED EMBODIMENTS

Figure 1:
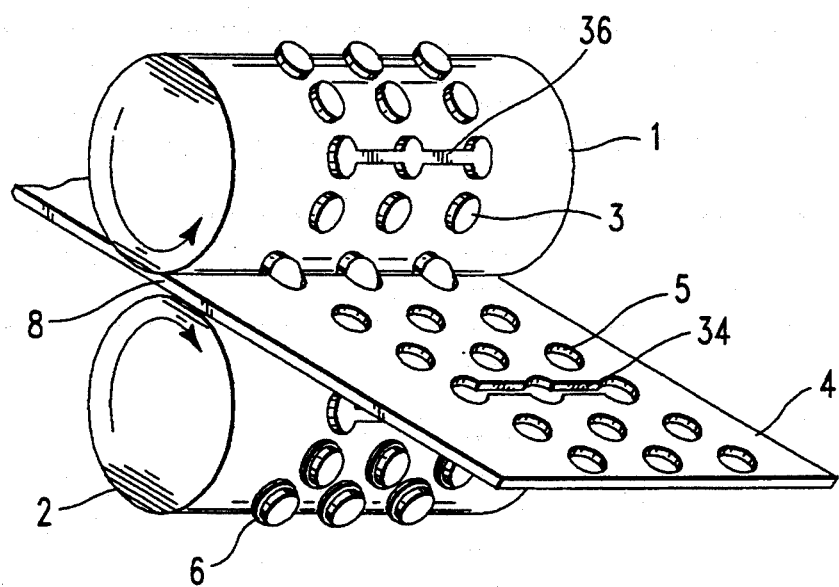
FIG. 1 is a schematic isometric view of a set of punching or displacing rollers formed with half-length punches forming holes in a "green" sheet being advanced or extruded.
Figure 9:
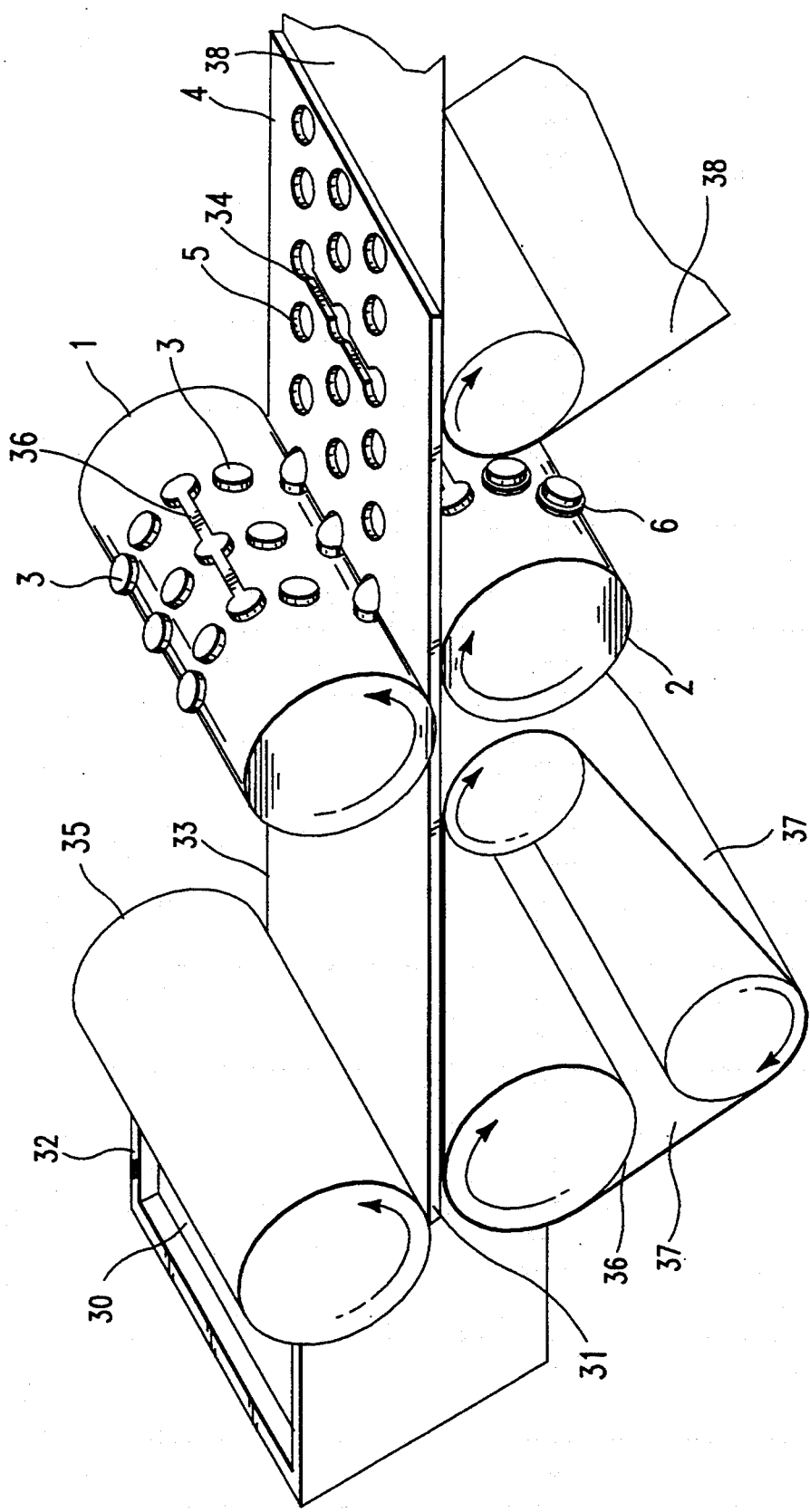
FIG. 9 is a schematic isometric view of a pair of rollers extruding a "green" sheet on to a carrier strip for advancement to a pair of forming, punching, or displacing rollers formed with half length punches forming holes in, and sizing, a "green" sheet.

Referring now to FIG. 1, a set of punching or displacing rollers 1 and 2 are shown as removing/displacing material, such as ceramic paste, from a source "green" sheet 4. The set of rollers 1 and 2, are shown forward of another set of rollers 35 and 36 in FIG. 9 that feed conventional ceramic paste slurry 30 from a bin into a sheet form 33, thence to rollers 1 and 2. The rollers 1 and 2 are located at an area where the "green" sheet 4 is handleable but soft enough to allow displacement of material by the machined rollers. Film or belt carriers 37 and 38 are used as necessary, to carry "green" sheet form 33 or "green" sheet 4, and are shown broken at rollers 1 and 2 to allow sheet pattern displacement and sizing by rollers 1 and 2. The carrier belt can be unbroken through throat 8 if all punching is from a single roller, that is the belt would ride over roller 2 through throat 8, and have roller 1 punch and displace against the interface carrier belt and roller 2.

Rollers 1 and 2 are machined with punches, bosses or pattern elements 3 of a diameter and spacing which corresponds with the desired size and spacing of holes 5 in the "green" sheet, and preferably of a length which corresponds to one half the thickness of the "green" sheet; the cut away areas between the punches being the depressions maintaining the sheet thickness and/or other desired features.

The rollers 1 and 2 are positioned so as to make line contact with each other at the ends of the punches 3 and are synchronized with each other so that corresponding punches on each will be aligned, that is, registered or mating with each other as they pass through the line connecting the centers of rotation of the two rollers.

Because the punches extend only halfway through the sheet, they do not need the thickness to provide the necessary strength when they extend all the way through. Thus the punches 3 can be thinner and closer to each other to define finer and closer holes. Also the shorter length introduces less arc in making the holes, again allowing for greater density and less displacement of any set material for each hole, thereby insuring less stress. Of course, any displacement action from punching at calendaring, rolling or extruding displacement action is much less stressful than that resulting from the later shearing action of punch and die operations.

The punches 3 themselves may be formed with concave surfaces 51 and 52 on their leading and trailing edges or surfaces (FIG. 8) to minimize compacting impact upon any set material around the leading and trailing edges of the hole. The shorter length of the mating punches minimizes these consideration, however.

To form surface circuit grooves 34 on the "green" sheet, the upper roller 1 may be machined with ridges 36 between appropriate punches 3. To form pads 38 (FIGS. 2 and 3), the inner ends of punches 3 of lower roller 2 may be formed with enlargements 6. Any combination of ridges and pads may be formed.

Figure 2:
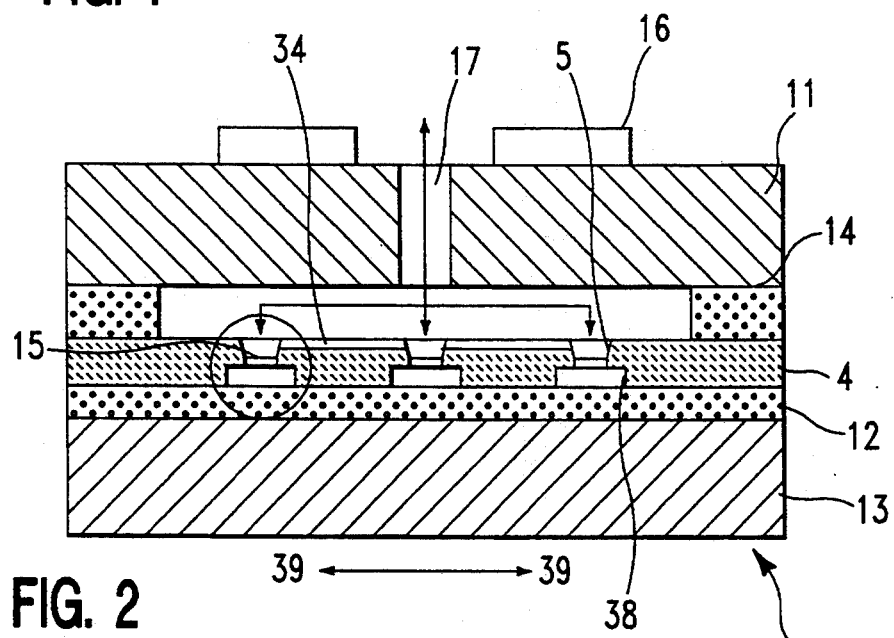
FIG. 2 is a cross-sectional view of a manifold constructed to pop out flash or diaphragms from a punched "green" sheet.
Figure 3:
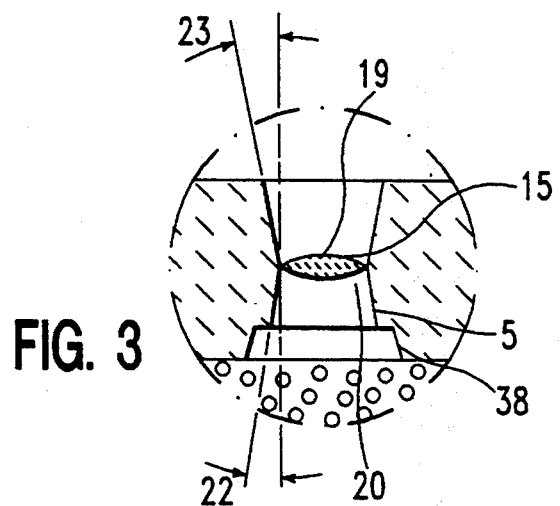
FIG. 3 is an enlarged view of the circled portion of FIG. 2 and showing a flash or diaphragm details.

Turning now to FIGS. 2 and 3, there is shown therein a manifold including a base plate 13 and an upper plate 11 for receiving there between the perforated "green" sheet 4 having incomplete holes 5 because of a flash or diaphragm 15. The upper surface of the lower plate 13 has secured to it a sponge pressure pad 12 on which the "green" sheet 4 is removably received. Secured to the lower surface of the upper plate 11 is a sponge perimeter seal 14 to enclose a space or chamber above the upper surface of the perforated "green" sheet 4. The space above the "green" sheet 4 is vented through an opening 17 in the upper plate 11 to a suitable source of steady or oscillatory pneumatic or other fluid pressure.

The manifold 10 may either be operated as a stationary device to receive individual sized or slit to width "green" sheets or it may be movably mounted to travel a distance 39 with the "green" sheet to pop out the flash or diaphragm, to open and release the sheet, and then to return to an earlier point on the "green" sheet extrusion line to close upon another section of the "green" sheet and travel therewith.

Figure 4:
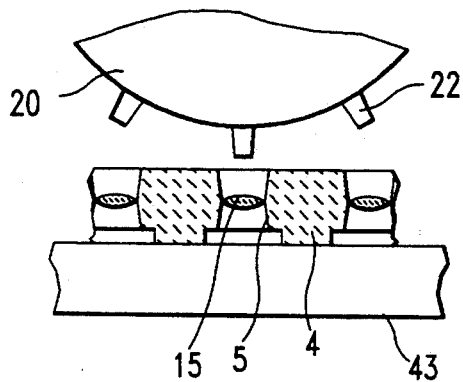
FIG. 4 is an alternative means involving a cylinder with spikes for popping flash or diaphragms.

Alternative forms of flash or diaphragm removers include a cylinder 20 (FIG. 4) surfaced with spikes 22 slightly longer than the depth of the flash or diaphragm and spaced as are the punches on the rollers 1 and 2. The rotation of the cylinder 20 would be synchronized with that of the rollers 1 and 2 so as to present the spikes 22 as the holes 5 in the "green" sheet 4 move by. A drive 43 may support sheet 4 against the action of spike 22 of cylinder 20.

Figure 5:
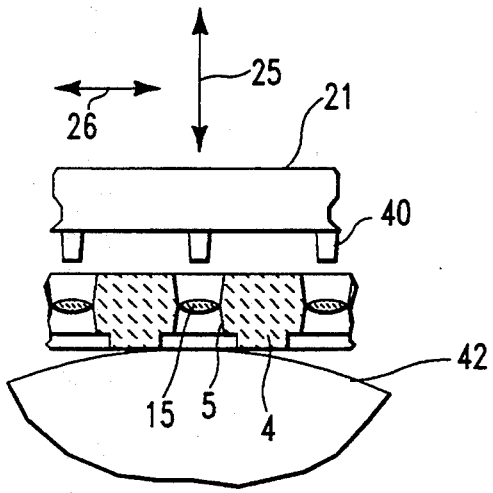
FIG. 5 is yet another alternative means involving a reciprocating platform for popping flash or diaphragms.

Another alternative flash or diaphragm remover could involve a plate or platform 21 (FIG. 5) having a row of spikes 40, and a drive 42 over which the "green" sheet 4 would pass, the drive 42 serving to support the sheet 4 against the action of spike 40 upon the flash or diaphragm 15.

Frame 21 may be mounted for rapid up and down movement 25 and for reciprocatory action 26 in which the frame moves horizontally at the "green" sheet speed while spikes 40 are lowering and rising in the openings 5.

Figure 6:
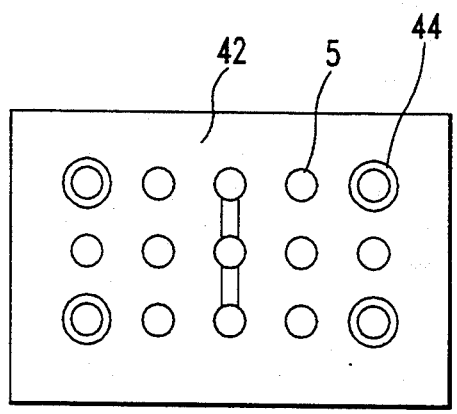
FIG. 6 is a top view of a "green" sheet showing counterholes and schematically through-holes.
Figure 7:
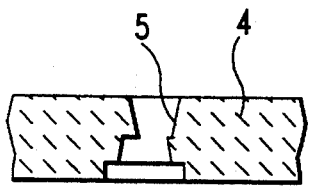
FIG. 7 is a cross-sectional view of a through-hole produced by a slight misalignment of mating punches.

A raw substrate 42 sized or slit to width from a "green" sheet is shown in FIG. 6. While the small through-holes 5 are only rendered schematically, counterholes 44 are shown on the four corners of the substrate.

In the manufacturing operation, a source bin 32 would be filled with a ceramic slurry 30 or the like such as a plastic powder. Rollers 35 and 36 would be set rotating with their surfaces bathing in the slurry, roller 35 counter clockwise and roller 36 clockwise. A "green" sheet would then be extruded between the rollers and advanced on a belt 37 to rollers 1 and 2. Thereafter rollers 1 and 2 would be set rotating, roller 1 counterclockwise and roller 2 clockwise, and synchronized with rollers 35 and 36. With the advance of the "green" sheet between rollers 1 and 2, the "green" sheet would have been sized by having its surface displaced, and have holes, ridges, and pads formed and setup about the respective aligned punches, bosses, or pattern of the rollers.

Some of the holes 5 may not yet be through-holes, but rather contain a flash or diaphragm 15. To remove the flashes or diaphragms 15 in sections of the "green" sheet, a section is preferably put in the manifold 10 (FIG. 2). When the space or chamber above the "green" sheet 4 in the manifold is sealed, as by the upper plate 11 with its perimeter seal 14 resting on the "green" sheet, air under pressure is admitted into the otherwise sealed manifold space to pop the flashes or diaphragms 15 downwards in their holes 5 to the spongy layer 12 which accommodates the dissipation of air below the diaphragm and assures a pressure differential on other unpopped diaphragms. A controlled porosity in the spongy layer can be used to minimize back pressure.

After popping the flashes or diaphragms 15, the air pressure is cut off and the manifold opened. As observed earlier, the manifold 10 may be mounted to travel with the "green" sheet while closed and to retreat while opened to a new section engaging position whereupon it closes again to pop any flashes or diaphragms therein. Spongy layer 12 is sufficiently impervious to air to maintain pressure in the manifold sealed space or chamber even if most of the holes are through-holes: that is, they do not have flashes or diaphragms. The remains of the flashes or diaphragms 15 can be removed easily from the layer 12 as by air jets during the open condition of the manifold.

While the popping of the flashes or diaphragms has been described as being done by pneumatic means, it will be apparent that hydraulic or other fluids may be employed. If liquids are employed, the flashes or diaphragms may be removed by ultrasonic action. Thus a transducer 16 may be mounted on top of the upper plate 11 to generate the requisite removal energy. Introduction and removal of liquids will be abetted by the degree of porousness of the spongy layer 12 and perimeter seal 14, coupled with proper withdrawal pump pressure.

Figure 8:
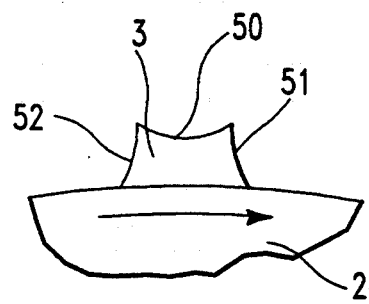
FIG. 8 is a side view of a punch showing the leading and trailing edge and free end concavities.

Removal of the flashes or diaphragms 15 may be aided by providing a slight concavity 50 on the ends of the roller punches 3 (FIG. 8). As best seen in FIG. 3, this produces a flash or diaphragm having a thicker middle 19 and a thinner perimeter 20. It results that popping action removes the flash or diaphragm from about the perimeter, thereby insuring a cleaner hole.

The thicker-in-the-middle flashes or diaphragms are also easily removed by using the spikes 22 of the rotating cylinder 20 or the spikes 40 of the movable plate 21.

As best seen in FIG. 3, through-holes produced by the punches of rollers 1 and 2 taper inward towards the middle from the surfaces of the "green" sheet. They are respectively indicated by the angles 22 and 23 of FIG. 3 or concave surfaces shown in FIG. 8. An advantage of this is that the solder or other conductive media subsequently squeegeed into the holes 5 to form electrical paths will be locked in position as their broader ends will not readily pass through the reduced interior diameters in the holes.

FIG. 3 also shows the pads 38 formed at the ends of holes 5 by the enlargements 6 at the base of the punches 3 of roller 2.

The grooves 34 formed in the "green" sheet 4 by the ridges 36 on roller 1 may be seen in FIG. 2. The grooves 34 allow the running of the heavy duty electrical circuits without adding measurably to the thickness of the multi-layered ceramic package.

It will be appreciated that applicant has provided a simple and inexpensive way to manufacture in large quantity perforated "green" sheets having holes that are small in size, closely spaced, and large in number, due in part to the thinness and shortness of the punches 3 on the calendaring, rolling or extruding rollers 1 and 2. Furthermore, that perforated "green" sheets having lower internal stresses will result from combining the punching operation with the calendaring, rolling, or extruding operation of the rollers 1 and 2, and from the use of short punches 3. Also, that additional geometries such as pads, counterholes, and surface grooves can be readily generated in "green" sheets. Moreover, in view of the continuous process operation, the operation is easy and reliable.

It will further be appreciated that applicant has provided effective means for quickly removing any flash or diaphragms obtaining in any of the "green" sheet holes after the punching operation. A manifold has been designed to pop flash or diaphragms by differential pressure or oscillation, as well as mechanical mechanisms utilizing rotary or translatory spikes.

It will also be appreciated that punches have been designed so that any flash or diaphragms created are more readily removed. Thus any flash or diaphragm created is thicker in the middle and thinner on the perimeter to facilitate more complete and effective removal.

It will too be appreciated that the "green" sheet holes created by the apparatus of the invention will lock through-hole solder or other conductive media in place. This, because the geometry of the roller punches 3 results in holes that internally have a smaller diameter. Therefore the enlarged diameter ends of the through-hole solder are blocked from moving endwise within the hole.

It will be still further appreciated that additional locking action of the solder or other conductive media within the through-hole can be achieved by having the registration of corresponding punches 3 on the two rollers 1 and 2 slightly off, so that an offset appears in the through-hole at the place they meet. Such design may be desirable for electronic components subject to rough environments as in the military.

While there have been described preferred embodiments, it will be apparent that other embodiments utilizing principles of the invention may be readily created by those skilled in the art and will fall within the spirit or scope of the appended claims.

What is claimed is:

1. In an apparatus for manufacturing sheets with through-holes for use as substrates of an electronic assembly, a roller having a pattern of high and low areas on its surface, an object presenting a firm surface making line contact with the roller pattern high areas, means for providing a malleable material to the roller, and means for rotating the roller so as to dispense a sheet having through-holes from the material past its surface line contact with the object, wherein the object is a second roller, wherein a plurality of high areas are formed on each roller, and the rollers are synchronized so that corresponding high areas mate with each other in the sheet to form holes through it.

2. An apparatus according to claim 1, wherein some of the high areas are ridges interconnecting mating high areas to form grooves in the surface of the sheet.

3. An apparatus according to claim 1, wherein mating high area have free ends and the free ends of mating high areas are slightly concave to cause any flash or diaphragm formed in the through-holes to have a thicker center than perimeter.

4. An apparatus according to claim 1, wherein the mating high areas are bosses whose combined length approximates the thickness of the sheet.

5. An apparatus according to claim 4, wherein each mating boss is approximately one-half the thickness of the sheet.

6. An apparatus according to claim 5, wherein each mating boss has a trailing surface and each hole has a trailing edge and the trailing surface of each boss is generated to minimize displacement of sheet material at the trailing edge of each hole made.

7. An apparatus according to claim 5, wherein each mating boss has a leading surface and each hole has a leading edge and the leading surface of each boss is generated to minimize displacement of the sheet material at the leading edge of each hole made.

8. An apparatus according to claim 6, wherein each hole also has a leading edge and the sheet through-holes have their leading and trailing edges surrounded by compressed material and may have flashes or diaphragms formed in some, and means for acting upon the perforated sheet to remove any of said flash or diaphragms from the through-holes.

9. In an apparatus for manufacturing sheets with through-holes for use as substrates of an electronic assembly, a roller having a pattern of high and low areas on its surface, an object presenting a firm surface making line contact with the roller pattern high areas, means for providing a malleable material to the roller, and means for rotating the roller so as to dispense a sheet having through-holes from the material past its surface line contact with the object, and a preceding set of synchronized rollers to form an uncured "green" sheet.

* * * * *